United States Patent [19]
Foerster

[11] Patent Number: 5,828,141
[45] Date of Patent: Oct. 27, 1998

[54] APPARATUS FOR SWITCHING AN INDUCTIVE LOAD

[75] Inventor: Ralf Foerster, Regensburg, Germany

[73] Assignee: Siemens Aktiengesellschaft, Munich, Germany

[21] Appl. No.: 887,470

[22] Filed: Jul. 2, 1997

[30] Foreign Application Priority Data

Jul. 2, 1996 [DE] Germany ................ 196 26 630.0

[51] Int. Cl.⁶ ..................... H01H 47/00; H03K 5/08
[52] U.S. Cl. ................ 307/125; 307/112; 307/139; 327/313; 327/321
[58] Field of Search ........................ 307/112, 113, 307/116, 125, 135, 139, 140; 361/54, 111; 327/309, 310, 313, 321, 328

[56] References Cited

U.S. PATENT DOCUMENTS 5,266,840  11/1993  Leipold et al. ................ 307/125
5,272,399  12/1993  Tihanyi et al. ................ 327/379
5,672,917   9/1997  Nakano ........................ 307/116
5,744,878   4/1998  Wachter et al. ................ 307/130

FOREIGN PATENT DOCUMENTS

0072523A2  2/1983  European Pat. Off. .
3109650A1  9/1982  Germany .

*Primary Examiner*—Jeffrey A. Gaffin
*Assistant Examiner*—Jonathan S. Kaplan
*Attorney, Agent, or Firm*—Herbert L. Lerner; Laurence A. Greenberg

[57] ABSTRACT

An apparatus for switching an inductive load includes a MOSFET switch and provides for limiting a voltage across the load during switching-off of the latter. One or two clamping circuits are used without zener diodes and with different, temperature-independent clamping voltages for the purpose of rapid demagnetization of the load in a constant demagnetization time.

5 Claims, 2 Drawing Sheets

5,828,141

APPARATUS FOR SWITCHING AN INDUCTIVE LOAD

BACKGROUND OF THE INVENTION

FIELD OF THE INVENTION

The invention relates to an apparatus for switching an inductive load with a MOSFET switch and with limiting of a voltage across the load.

A circuit of that type is disclosed in German Published, Non-Prosecuted Patent Application DE 31 09 650 A1, in which case a zener diode that is reverse-biased toward the gate is connected in series with a blocking diode which is forward-biased toward the gate, between the drain and the gate.

Published European Patent Application 0 072 523 A2 discloses a protective circuit against excessively high current through a field-effect transistor in a load circuit, with a switch being controlled by a current measuring circuit connected in parallel with the controlled path of the field-effect transistor. The switch limits the control voltage at the control input of the field-effect transistor.

A paper by H. SAX et al. entitled: "Intelligente Leistungs-MOSFET" [Intelligent Power MOSFETs] in Elektronik-Informationen No. 6, 1994, pages 26 and 27 shows a protective circuit for a MOSFET in which a parallel circuit formed by a switch and a resistor is connected in the gate supply line of the MOSFET. The switch bridges the resistor during normal operation and is opened in the event of overcurrent, overtemperature or overvoltage.

Many inductive loads, in particular fuel injection valves for internal combustion engines, must be demagnetized as rapidly as possible and with low variation in the switch-off time. In the majority of cases, the voltage across the inductive load is limited through the use of zener diodes to a specific value (zener voltage), which is selected to be as large as possible in order to enable a rapid switch-off but without exceeding the maximum permissible voltage of the semiconductor switches. However, the reverse voltages of such zener diodes are affected by large manufacturing tolerances and are highly temperature-dependent. As a result, in mass production the switch-off times, that is to say the demagnetization times, are also subjected to variation and change in a temperature-dependent manner. In the case of such circuits in fuel injection valves for internal combustion engines, for example, the amounts of fuel actually injected thus deviate to a greater or lesser extent from the calculated amounts, depending on the specimen and temperature.

SUMMARY OF THE INVENTION

It is accordingly an object of the invention to provide an apparatus for switching an inductive load, which overcomes the hereinafore-mentioned disadvantages of the heretofore-known devices of this general type and which makes it possible, during switch-off, to maintain a predetermined voltage across the load exactly and in a manner largely independent of temperature, and to ensure rapid demagnetization of the load with a constant demagnetization time.

With the foregoing and other objects in view there is provided, in accordance with the invention, an apparatus for switching an inductive load, in particular a fuel injection valve of an internal combustion engine, comprising an operating voltage source having a positive pole and a negative pole; a first series circuit including a load to be switched and an electronic low-side MOSFET switch having a gate and a drain, the first series circuit connected between the positive pole and the negative pole of the operating voltage source; a second series circuit including a control switch and a control voltage source, the second series circuit connected between the gate of the MOSFET switch and the negative pole of the operating voltage source, the control voltage source having a negative pole connected to the negative pole of the operating voltage source; a first resistor connected parallel to the control switch; and a clamping circuit including a second resistor having one terminal connected to the gate of the MOSFET switch and having another terminal; a pnp transistor having an emitter connected to the other terminal of the second resistor, having a collector connected to the negative pole of the operating voltage source and having a base; a constant-current source connected to the negative pole of the operating voltage source; a further switch connected between the constant-current source and the base of the pnp transistor; and a third resistor connected between the base of the pnp transistor and the drain of the MOSFET switch.

With the objects of the invention in view, there is also provided an apparatus for switching an inductive load, in particular a fuel injection valve of an internal combustion engine, comprising an operating voltage source having a positive pole and a negative pole; a first series circuit including a load to be switched and an electronic low-side MOSFET switch having a gate, the first series circuit connected between the positive pole and the negative pole of the operating voltage source; a first resistor connected between the gate of the MOSFET switch and the negative pole of the operating voltage source; a second series circuit including a control switch and a control voltage source, the second series circuit connected in parallel with the first resistor, the control voltage source having a negative pole connected to the negative pole of the operating voltage source; a third series circuit including a freewheeling diode and a further MOSFET switch having a gate and a source, the third series circuit connected in parallel with the load; a second resistor connected to the gate of the further MOSFET switch; a further voltage source having a negative pole connected to the source of the further MOSFET switch and to the positive pole of the operating voltage source, the further voltage source having a positive pole connected through the second resistor to the gate of the further MOSFET switch; and a clamping circuit including a third resistor having one terminal connected to the gate of the further MOSFET switch and having another terminal; a pnp transistor having an emitter connected to the other terminal of the third resistor, having a collector connected to the positive pole of the operating voltage source and having base; a constant-current source connected to the negative pole of the operating voltage source; a switch connected between the constant-current source and the base of the pnp transistor; and a fourth series circuit including a fourth resistor having one terminal connected to the load and another terminal, and a blocking diode connected between the other terminal of the fourth resistor and the base of the pnp transistor.

In accordance with another feature of the invention, there is provided a further clamping circuit connected in parallel with the first-mentioned clamping circuit, the further clamping circuit including a fifth resistor having one terminal connected to the gate of the further MOSFET switch and having another terminal; another pnp transistor having an emitter connected to the other terminal of the fifth resistor, having a collector connected to the positive pole of the operating voltage source and having a base; another constant-current source connected to the negative pole of the operating voltage source; another switch connected between the other constant-current source and the base of the other pnp transistor; and a fifth series circuit including a sixth resistor having one terminal connected to the load and another terminal, and a blocking diode connected between the other terminal of the sixth resistor and the base of the pnp transistor.

In accordance with a further feature of the invention, the first-mentioned clamping circuit K1 and the further clamping circuit K2 are dimensioned to produce different clamping voltages Uk1>Uk2, where Uk1=I1*R2, Uk2=I2*R4 and R3<R1, and where I1 is a constant current of the constant-current source of the first-mentioned clamping circuit K1, I2 is a constant current of the other constant-current source of the further clamping circuit K2, R1 is the third resistor, R2 is the fourth resistor, R3 is the fifth resistor, and R4 is the sixth resistor.

In accordance with a concomitant feature of the invention, there is provided a blocking diode forward-biased from the base of the other pnp transistor to the gate of the further MOSFET switch.

Other features which are considered as characteristic for the invention are set forth in the appended claims.

Although the invention is illustrated and described herein as embodied in an apparatus for switching an inductive load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Referring to the figures of the drawings in general it is noted that control and MOSFET switches which are described and illustrated therein may also be IGBT or bipolar Darlington transistors, for example. These and illustrated pnp transistor switches in each case can be replaced by individual transistors or by transistor combinations.

It also lies within the scope of the invention to portray the circuits that are implemented with low-side switches by using circuits with high-side switches, which only differ from the circuits described and claimed by inverse transistor types and multipolarity reversals.

Figure 1:
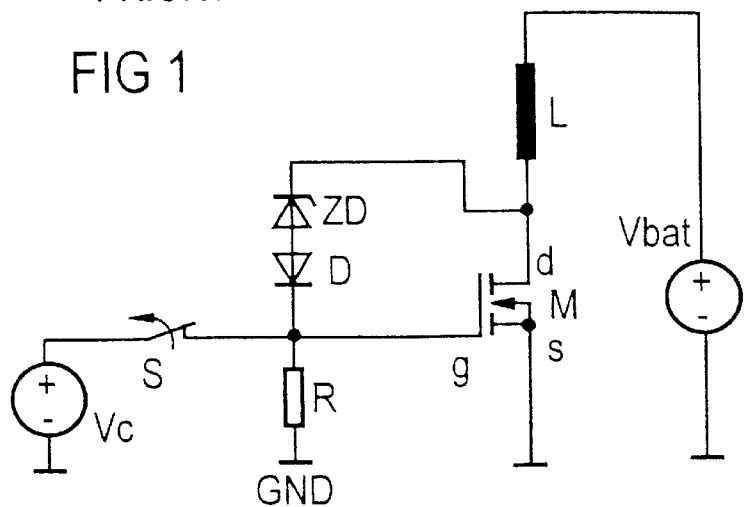
FIG. 1 is a schematic circuit diagram of a known apparatus for switching an inductive load.

Referring now to the figures of the drawings in detail and first, particularly, to FIG. 1 thereof, there is seen a known circuit in which a series connection of an inductive load L and a low-side MOSFET switch M is connected to poles +Vbat and GND of an operating voltage source Vbat. The MOSFET switch M has a drain d connected to the load and a source s connected to the negative pole GND. A resistor R is usually connected between a gate g of the MOSFET switch M and the negative pole GND. A control voltage source Vc which is connected in parallel with the resistor R has a positive pole +Vc that is connected through a control switch s to the gate g. A negative pole -Vc of the control voltage source Vc is connected to the negative pole GND of the operating voltage source Vbat. A zener diode ZD which is reverse-biased toward the gate g is connected in series with a blocking diode D which is forward-biased toward the gate g, between the drain d and the gate g. When the MOSFET switch M is in the on state, the blocking diode D prevents a flow of current from the gate g to the drain d, which is at low potential in that case.

In the switched-off state of the circuit, the control switch S is open and the MOSFET switch M is thus in the off state or high-impedance state and no current flows.

In order to switch the load on, the control switch S is closed and the MOSFET switch M is thus turned on. An increasing current flows from the positive pole +Vbat through the load L and the MOSFET switch M to the negative pole GND. The load is switched on.

In order to switch the load L off, the switch S is opened and the gate g of the MOSFET switch M is discharged through the resistor R. The potential at the drain d rises until a current flows through the diodes ZD and D, when the zener voltage of the zener diode ZD is reached. The gate g is recharged through the use of the current through the diodes ZD and D. As a result, a constant drain potential is established until the coil L is demagnetized.

The variation and temperature dependence of the zener voltages as well as the large power loss across the zener diode if the gate g is to be rapidly discharged through a small resistor R, are disadvantageous in circuits of that type. Moreover, integration of that circuit in an integrated circuit of customary technology (maximum 35V) at the frequently required zener voltages of 80V to 400V is not possible.

Figure 2:
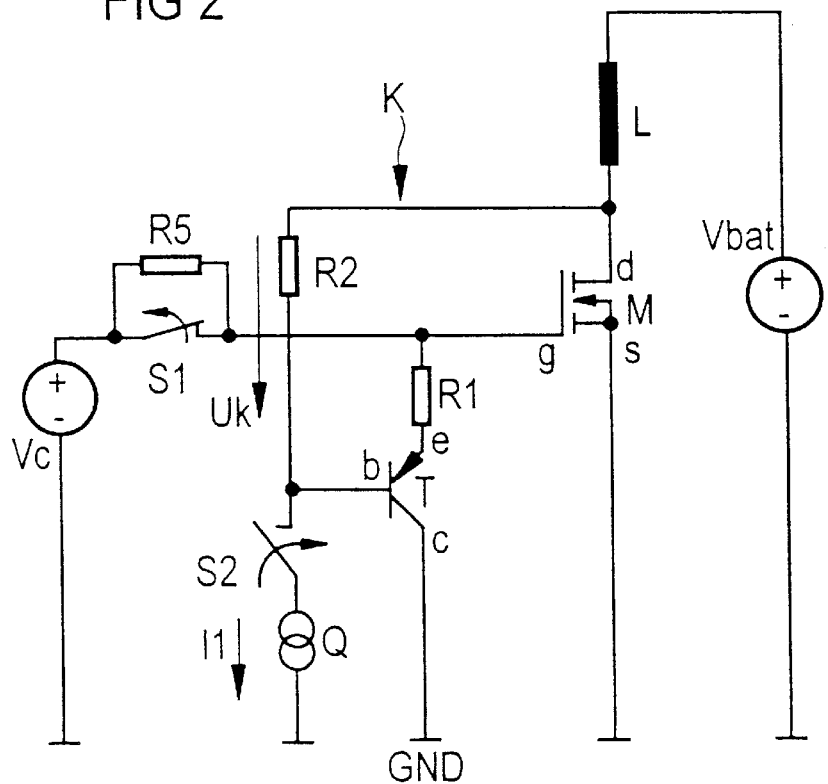
FIG. 2 is a circuit diagram of a first exemplary embodiment of an apparatus according to the invention.

FIG. 2 shows a first diagrammatic exemplary embodiment of a switching apparatus according to the invention, in which the operating voltage source Vbat, the load L, the MOSFET switch M, the control voltage source Vc and the control switch S1 are connected in the manner already described for FIG. 1. In this case a first resistor R5 is connected in parallel with the control switch S1. A clamping circuit K is provided instead of the zener diode ZD. This clamping circuit includes a second resistor R1 having one terminal which is connected to the gate g of the MOSFET switch M, a pnp transistor T having an emitter e that is connected to another terminal of the second resistor R1 and a collector c which is connected to the negative pole GND of the operating voltage source Vbat, a constant-current source Q which on one hand is connected to the negative pole GND and on the other hand is connected through a further switch S2 to a base b of the pnp transistor T, and a third resistor R2 which on one hand is connected to the base b of the pnp transistor T and on the other hand is connected to the drain d of the MOSFET switch M.

In the switched-off state, the switches S1 and S2 are open and the operating voltage source Vbat and the control voltage source Vc can be isolated in a non-illustrated manner from the circuit and are connected to it at least during operation.

In order to switch the load on, the control switch S1 is closed and the MOSFET switch M is thus turned on. An increasing current flows from the positive pole +Vbat through the load L and the MOSFET switch M to the negative pole GND. The load is switched on.

In order to switch the load L off, the switch S1 is opened and the switch S2 is simultaneously closed. A current I1 flows through the constant-current source Q from the gate g through the resistor R1 and the emitter-base junction of the pnp transistor T to the negative pole GND. That current turns the transistor T on, as a result of which the gate g of the MOSFET switch M is discharged. The drain potential rises, and an increasing part of the current I1 flows from the drain d through the third resistor R2 into the constant-current source Q. When the drain potential has reached a value at which the entire current I1 flows through the resistor R2, the transistor T is again turned off and the discharging of the gate g is interrupted.

During the clamping, a voltage which essentially depends on a voltage Uk=I1*R2 across the resistor R2 is established at the drain d. The gate g is slightly recharged through the resistor R5. The gate discharge rate can be determined by the value of the resistor R1. The desired clamping voltage Uk, which corresponds to the zener voltage of the circuit according to FIG. 1, can be set by the value of the resistor R2 and of the current I1. This circuit can also be readily integrated for large clamping voltages, with the exception of the third resistor R2, in an IC of customary technology.

However, chopper operation (periodic recharging in the on state) is not possible with the described circuit according to FIG. 2. For this purpose, a freewheeling diode would have to be connected in parallel with the load and would in turn prevent rapid demagnetization.

Figure 3:
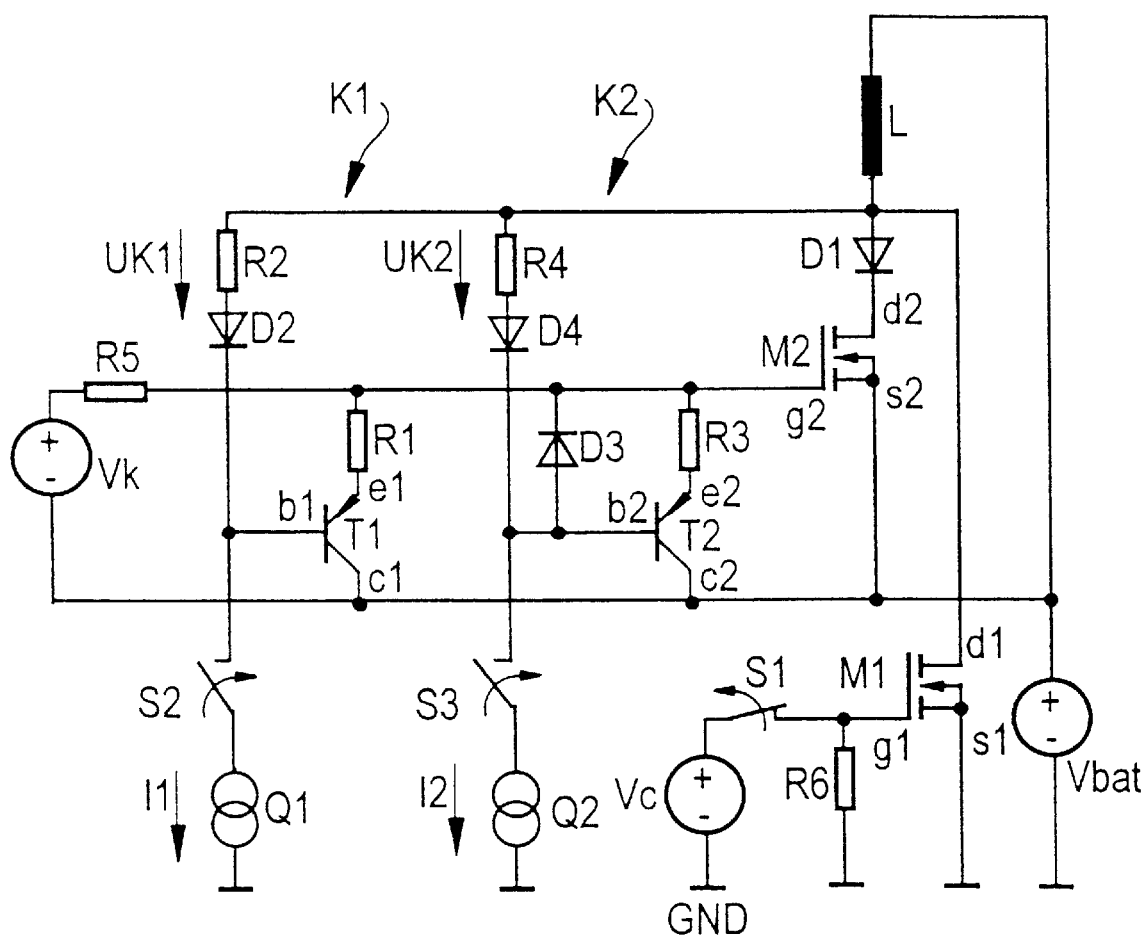
FIG. 3 is a circuit diagram of a second exemplary embodiment of an apparatus according to the invention.

FIG. 3 illustrates a further diagrammatic exemplary embodiment of a switching apparatus according to the invention in which chopper operation is also possible.

A first series circuit which is disposed in this circuit is formed by a load L and an electronic low-side MOSFET switch M1 and is connected between the positive pole +Vbat and the negative pole GND of the operating voltage source Vbat. A fourth resistor R6 is connected between a gate g1 of the MOSFET switch M1 and the negative pole GND of the operating voltage source Vbat. A second series circuit formed by a control switch S1 and a control voltage source Vc is connected in parallel with the fourth resistor R6. A negative pole −Vc of the control voltage source Vc is connected to the negative pole GND of the operating voltage source Vbat. A third series circuit formed by a freewheeling diode Di and a further MOSFET switch M2 is connected in parallel with the load L.

A further voltage source Vk has a negative pole −Vk connected to a source s2 of the further MOSFET switch M2 and to the positive pole +Vbat of the operating voltage source Vbat. The further voltage source Vk has a positive pole +Vk connected through a first resistor R5 to a gate g2 of the further MOSFET switch M2.

The circuit firstly has a clamping circuit K1 with a second resistor R1 having one terminal which is connected to the gate g2 of the further MOSFET switch M2. Furthermore, a pnp transistor T1 is provided having an emitter e1 that is connected to another terminal of the second resistor R1 and a collector c1 which is connected to the positive pole +Vbat of the operating voltage source Vbat. A constant-current source Q1 is set to a constant current I1 that is sufficient for complete opening of the pnp transistor T1 and brings about a desired clamping voltage Uk1. On one hand the constant-current source Q1 is connected to the negative pole GND of the operating voltage source Vbat and on the other hand it is connected through a switch S2 to a base b1 of the pnp transistor T1. A fourth series circuit formed by a third resistor R2 and a blocking diode D2 is connected between the load L and the base of the pnp transistor T1.

Furthermore, a further clamping circuit K2 which is connected in parallel with the clamping circuit K1 has a fifth resistor R3 with one terminal that is connected to the gate g2 of the further MOSFET switch M2. Additionally, a pnp transistor T2 is provided with an emitter e2 that is connected to another terminal of the fifth resistor R3 and a collector c2 which is connected to the positive pole +Vbat of the operating voltage source Vbat. A constant-current source Q2 is set to a constant current I2 that is sufficient for complete opening of the pnp transistor T2 and brings about a desired clamping voltage Uk2<Uk1. On one hand, the constant-current source Q2 is connected to the negative pole GND of the operating voltage source Vbat and on the other hand it is connected through a switch S3 to the base b2 of the pnp transistor T2. A fifth series circuit formed by a sixth resistor R4 and a blocking diode D4 is connected between the load L and the base b2 of the pnp transistor T2.

The resistors in FIG. 3 have been identified above with the same reference symbols as in FIG. 2 for ease of comprehension. However, when viewing the embodiment of FIG. 3 alone, the first resistor is R6, the second resistor is R5, the third resistor is R1 and the fourth resistor is R2.

In the switched-off state, all of the switches S1, S2 and S3 in this circuit are open and the voltage source Vc is isolated from the circuit through the switch S1.

In order to switch the load on, the control switch S1 is closed and the MOSFET switch M1 is thus turned on. An increasing current flows from the positive pole +Vbat through the load L and the MOSFET switch M1 to the negative pole GND. The load is switched on. In the switched-on state, the load L can be recharged (chopper operation), for example by chopped operation of the switch S1 at a specific duty ratio or cycle, in order to maintain a specific load current. During chopper operation, when the MOSFET switch M1 is switched off, the freewheeling circuit (the freewheeling diode D1 and the MOSFET switch M2) accepts the current through the load L.

The demagnetization time of an inductive load is determined by the voltage across it. In the circuits according to FIGS. 1 and 2, this voltage is dependent not only on the zener voltage and the clamping voltage, respectively, but also on the operating voltage Vbat.

In the exemplary embodiment according to FIG. 3, this dependence on the operating voltage Vbat is eliminated since clamping to an independent voltage (Uk1 and Uk2) is effected through the freewheeling circuit.

As in the exemplary embodiment according to FIG. 2, it is possible, in principle, to provide a single clamping circuit. However, in that case in order to avoid an excessively large overshoot, caused by transistor capacitances, of the potential at the drain d (FIG. 2) or at the drain d1 (FIG. 3) when the load L is switched off, the second resistor R1 between the gate g of the MOSFET switch M and the emitter e of the pnp transistor T must not be selected to be too small. However, that means that the MOSFET switch M2 opens slowly and after a long dead time and that the demagnetization time of the load cannot be as small as desired. However, given the inventive use of two clamping circuits K1 and K2, as explained below, the gate g2 of the MOSFET switch M2 can be discharged more rapidly and the demagnetization of the load can be accelerated without an excessively large overshoot.

The two clamping circuits K1 and K2 which are connected in parallel with one another are dimensioned to achieve different clamping voltages Uk1>Uk2, where Uk1=I1*R2 and Uk2=I2*R4, where R3<R1.

In order to demagnetize the load L, the switch S1 is opened. The switches S2 and S3 are simultaneously closed. As a result, a current I1 flows from the gate g2 through elements R1-e1-b1-Q1 to GND, and a current I2 flows from the gate g2 through elements R3-e2-b2-Q2 to GND, and through the operating voltage source Vbat to the negative pole −Vk. A correspondingly amplified current I1*v1 flows through elements R1-e1-c1, and a correspondingly amplified current I2*v2 flows through elements R3-e2-c2, to the negative pole –Vk, as a result of which the gate g2 of the MOSFET switch M2 is discharged. As a result, the potential at the drain d2 rises until the clamping voltage Uk2 is reached and the entire current I2 flows through the resistor R4 and the pnp transistor T2 is turned off.

Therefore, in the further course of events, the gate g2 is only depleted with a current I1*v1 until the load is demagnetized, as a result of which a large overshoot is reliably avoided.

An excessively large reverse voltage across the base-emitter junction of the pnp transistor T2 is avoided by a blocking diode D3, which is forward-biased from the base b2 of the pnp transistor T2 to the gate g2 of the MOSFET switch M2.

I claim:

1. An apparatus for switching an inductive load, comprising:
    an operating voltage source having a positive pole and a negative pole;
    a first series circuit including a load to be switched and an electronic low-side MOSFET switch having a gate and a drain, said first series circuit connected between the positive pole and the negative pole of said operating voltage source;
    a second series circuit including a control switch and a control voltage source, said second series circuit connected between the gate of said MOSFET switch and the negative pole of said operating voltage source, said control voltage source having a negative pole connected to the negative pole of said operating voltage source;
    a first resistor connected parallel to said control switch; and
    a clamping circuit including:
        a second resistor having one terminal connected to the gate of said MOSFET switch and having another terminal;
        a pnp transistor having an emitter connected to the other terminal of said second resistor, having a collector connected to the negative pole of said operating voltage source and having a base;
        a constant-current source connected to the negative pole of said operating voltage source;
        a further switch connected between said constant-current source and the base of said pnp transistor; and
        a third resistor connected between the base of said pnp transistor and the drain of said MOSFET switch.

2. An apparatus for switching an inductive load, comprising:
    an operating voltage source having a positive pole and a negative pole;
    a first series circuit including a load to be switched and an electronic low-side MOSFET switch having a gate, said first series circuit connected between the positive pole and the negative pole of said operating voltage source;
    a first resistor connected between the gate of said MOSFET switch and the negative pole of said operating voltage source;
    a second series circuit including a control switch and a control voltage source, said second series circuit connected in parallel with said first resistor, said control voltage source having a negative pole connected to the negative pole of said operating voltage source;
    a third series circuit including a freewheeling diode and a further MOSFET switch having a gate and a source, said third series circuit connected in parallel with the load;
    a second resistor connected to the gate of said further MOSFET switch;
    a further voltage source having a negative pole connected to the source of said further MOSFET switch and to the positive pole of said operating voltage source, said further voltage source having a positive pole connected through said second resistor to the gate of said further MOSFET switch; and
    a first clamping circuit including:
        a third resistor having one terminal connected to the gate of said further MOSFET switch and having another terminal;
        a pnp transistor having an emitter connected to the other terminal of said third resistor, having a collector connected to the positive pole of said operating voltage source and having base;
        a constant-current source connected to the negative pole of said operating voltage source;
        a switch connected between said constant-current source and the base of said pnp transistor; and
        a fourth series circuit including a fourth resistor having one terminal connected to the load and another terminal, and a blocking diode connected between the other terminal of said fourth resistor and the base of said pnp transistor.

3. The apparatus according to claim 2, including a second clamping circuit connected in parallel with said first clamping circuit, said second clamping circuit including:
    a fifth resistor having one terminal connected to the gate of said further MOSFET switch and having another terminal;
    another pnp transistor having an emitter connected to the other terminal of said fifth resistor, having a collector connected to the positive pole of said operating voltage source and having a base;
    another constant-current source connected to the negative pole of said operating voltage source;
    another switch connected between said other constant-current source and the base of said other pnp transistor; and
    a fifth series circuit including a sixth resistor having one terminal connected to the load and another terminal, and a blocking diode connected between the other terminal of said sixth resistor and the base of said pnp transistor.

4. The apparatus according to claim 3, wherein:
    said first clamping circuit K1 and said second clamping circuit K2 are dimensioned to produce different clamping voltages Uk1>Uk2, where:
        Uk1=I1*R2, Uk2=I2*R4 and R3<R1, and where:
            I1 is a constant current of said constant-current source of said first clamping circuit K1,
            I2 is a constant current of said other constant-current source of said second clamping circuit K2,
            R1 is a resistance of said third resistor,
            R2 is a resistance of said fourth resistor,
            R3 is a resistance of said fifth resistor, and
            R4 is a resistance of said sixth resistor.

5. The apparatus according to claim 3, including a blocking diode forward-biased from the base of said other pnp transistor to the gate of said further MOSFET switch.

* * * * *